United States Patent
Ham et al.

(10) Patent No.: US 10,615,030 B2
(45) Date of Patent: Apr. 7, 2020

(54) METHOD OF PREPARING NITROGEN-DOPED GRAPHENE

(71) Applicant: GWANGJU INSTITUTE OF SCIENCE AND TECHNOLOGY, Gwangju (KR)

(72) Inventors: Moon Ho Ham, Gwangju (KR); Myung Woo Son, Gwangju (KR)

(73) Assignee: GWANGJU INSTITUTE OF SCIENCE AND TECHNOLOGY, Gwangju (KR)

( * ) Notice: Subject to any disclaimer, the term of this patent is extended or adjusted under 35 U.S.C. 154(b) by 0 days.

(21) Appl. No.: 15/911,991

(22) Filed: Mar. 5, 2018

(65) Prior Publication Data
US 2018/0254183 A1 Sep. 6, 2018

(30) Foreign Application Priority Data
Mar. 2, 2017 (KR) .................. 10-2017-0027117

(51) Int. Cl.
| | | |
|---|---|---|
| H01L 21/02 | (2006.01) | |
| C23C 16/26 | (2006.01) | |
| H01L 21/04 | (2006.01) | |
| C01B 32/186 | (2017.01) | |
| C30B 29/02 | (2006.01) | |

(Continued)

(52) U.S. Cl.
CPC ...... H01L 21/02576 (2013.01); C01B 32/186 (2017.08); C23C 16/26 (2013.01); C30B 29/02 (2013.01); H01L 21/0262 (2013.01); H01L 21/02491 (2013.01); H01L 21/02527 (2013.01); H01L 21/041 (2013.01); H01L 29/1606 (2013.01); H01L 29/167 (2013.01); H01L 29/66045 (2013.01); H01L 29/66742 (2013.01);

(Continued)

(58) Field of Classification Search
CPC .............. C30B 29/02; H01L 29/78696; H01L 29/66742; H01L 29/778; C01B 32/186
See application file for complete search history.

(56) References Cited

U.S. PATENT DOCUMENTS

2014/0120270 A1* 5/2014 Tour .................. C23C 16/26
427/596

FOREIGN PATENT DOCUMENTS

| KR | 10-2013-0022565 A | 3/2013 |
|---|---|---|
| KR | 10-1484850 B1 | 1/2015 |
| WO | WO 2012/118350 A2 | 9/2012 |

OTHER PUBLICATIONS

Jin et. al., "Large-Scale Growth and Characterization of Nitrogen-Doped Monolayer Graphene Sheets", ACS nano, vol. 5, pp. 4112-4117 (Year: 2011).*

(Continued)

*Primary Examiner* — Phat X Cao
*Assistant Examiner* — Victor V Barzykin
(74) *Attorney, Agent, or Firm* — Buchanan Ingersoll & Rooney PC

(57) ABSTRACT

An exemplary method of preparing nitrogen-doped graphene whereby it is possible to synthesize graphene having an improved surface coverage and a uniform single layer, and to prepare high quality graphene in a large area. In addition, an aromatic compound containing nitrogen can be used as a carbon source and nitrogen-doped graphene can be thus synthesized as nitrogen doped in the synthesis process. It is possible to control the electrical properties of graphene depending on the nitrogen doping.

11 Claims, 5 Drawing Sheets

(51) Int. Cl.
*H01L 29/786* (2006.01)
*H01L 29/16* (2006.01)
*H01L 29/167* (2006.01)
*H01L 29/66* (2006.01)
*H01L 29/778* (2006.01)

(52) U.S. Cl.
CPC .. *H01L 29/78684* (2013.01); *H01L 29/78696* (2013.01); *H01L 29/778* (2013.01)

(56) References Cited

OTHER PUBLICATIONS

Li et. al., "Graphene Films with Large Domain Size by a two-step Chemical Vapor Deposition Process", Nano Lett., vol. 10, pp. 4328-4334 (Year: 2010).*

* cited by examiner

METHOD OF PREPARING NITROGEN-DOPED GRAPHENE

CLAIM FOR PRIORITY

This application claims priority to Korean Patent Application No. 2017-0027117 filed on Mar. 2, 2017 in the Korean Intellectual Property Office (KIPO), the entire contents of which are hereby incorporated by reference.

BACKGROUND

1. Technical Field

Exemplary embodiments of the invention generally relate to a method of preparing nitrogen-doped graphene.

2. Related Art

High quality graphene having a large area can be synthesized by chemical vapor deposition, and various doping methods are utilized to improve the electrical properties of graphene. Such a graphene doping method includes a method in which synthesized graphene is subjected to a high temperature heat treatment in a gas atmosphere containing a dopant (FIG. 1) or a surface treatment using metal nanoparticles or a polymer.

However, such a method increases the process cost since it requires additional processes. Moreover, the doping method using a heat treatment cannot be applied to an electronic device using a semiconductor device and an organic substrate which are susceptible to a high temperature. In addition, the doping method using a surface treatment has a disadvantage that the doping effect decreases with time since doping is achieved by a weak bond between graphene and the metal nanoparticles or polymer.

Meanwhile, a method of preparing nitrogen-doped graphene using pyridine in a large area has been reported, and pyridine is an aromatic substance obtained by substituting one carbon atom of benzene with nitrogen and used to synthesize nitrogen-doped graphene. However, the results of the previous research indicate that discrete graphene having a flake shape is synthesized and it cannot be thus applied to the fabrication of large area devices.

Hence, it is required to develop a technique capable of preparing high surface coverage and high quality graphene having a large area by solving such a disadvantage of the prior art.

| References | | |
|---|---|---|
| WO | 2012/118350 | October 2012 |
| KR | 10-1484850 | January 2015 |
| KR | 10-2013-0022565 | March 2013 |

SUMMARY OF THE INVENTION

Exemplary embodiments of the invention have been made to solve the disadvantages of the prior art as described above and to provide an invention capable of preparing high surface coverage and high quality graphene, particularly nitrogen-doped graphene having a large area.

According to an exemplary embodiment of the invention, a method of preparing nitrogen-doped graphene is disclosed which includes (a) loading a catalytic metal into a chemical vapor deposition system, (b) increasing an internal temperature of the chemical vapor deposition system to conduct a heat treatment of the catalytic metal, and (c) injecting a nitrogen-containing aromatic compound into the chemical vapor deposition system.

DETAILED DESCRIPTION

Figure 1:
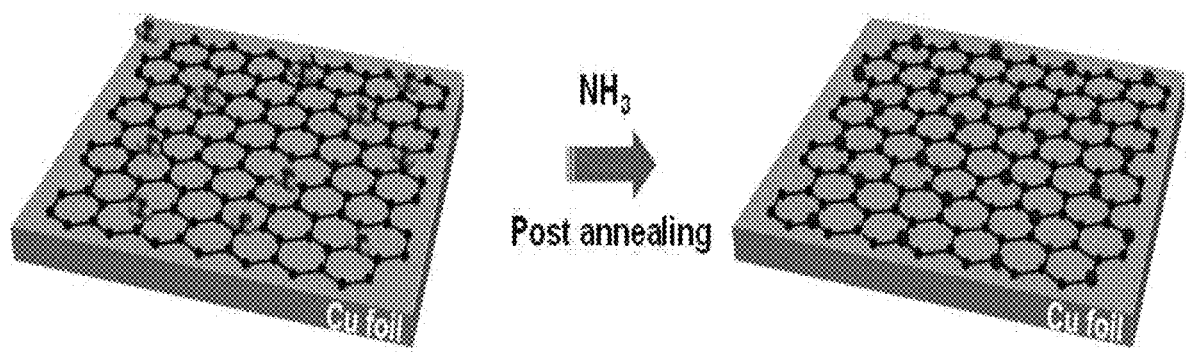
FIG. 1 illustrates a method of doping synthesized graphene by a high temperature heat treatment in a gas atmosphere containing a dopant.
Figure 2:
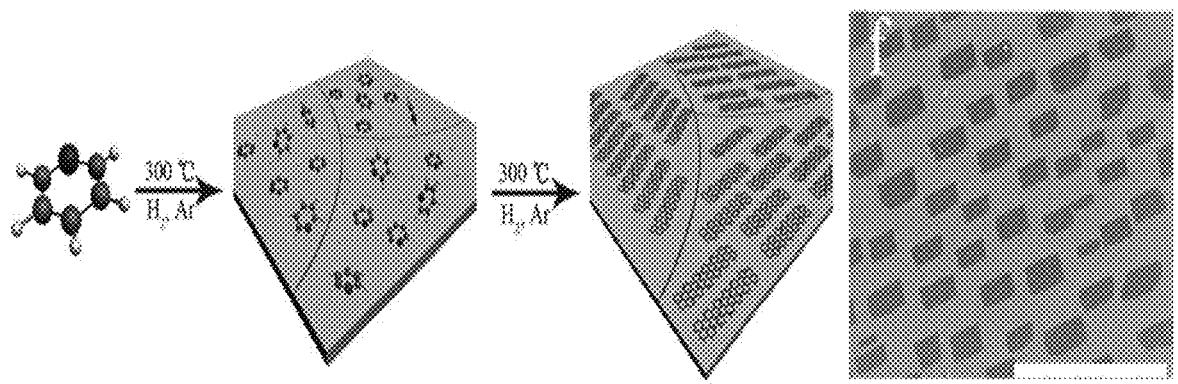
FIG. 2 schematically illustrates a process of preparing nitrogen-doped graphene using pyridine.

Hereinafter, various aspects and embodiments of the invention will be described in more detail.

According to an aspect of the invention, a method of preparing nitrogen-doped graphene is disclosed which includes (a) loading a catalytic metal into a chemical vapor deposition system, (b) increasing an internal temperature of the chemical vapor deposition system to conduct a heat treatment of the catalytic metal, and (c) injecting a nitrogen compound into the chemical vapor deposition system.

Through the heat treatment, it is possible to remove a native oxide film existing on the catalytic metal and to increase the crystal grains of the catalytic metal.

In an exemplary embodiment, the injection of a nitrogen compound in the step (c) is conducted by generating the nitrogen compound using a bubbler and injecting the nitrogen compound using an inert gas as a carrier gas.

In another exemplary embodiment, hydrogen gas is also injected together in the step (c). In the case of injecting hydrogen gas together, the dehydrogenation reaction of the nitrogen compound is promoted and thus a favorable effect can be obtained in the synthesis of graphene. The amount of hydrogen injected may be from 100 to 200 sccm.

In still another exemplary embodiment, the injection of a nitrogen compound in the step (c) is conducted by injecting the nitrogen compound in (c1) the amount of the first nitrogen compound injected and then injecting the nitrogen compound in (c2) the amount of the second nitrogen compound injected and the amount of the second nitrogen compound injected is greater than the amount of the first nitrogen compound injected. The growth rate of graphene decreases from a certain time point (for example, hour) in the case of a one-step process, but it is possible to prevent the growth rate of graphene from decreasing in the case of the two-step process described above.

In still another exemplary embodiment, the amount of the first injected and the amount of the second injected are controlled by the amount of the first carrier gas injected and the amount of the second carrier gas injected, respectively.

In still another exemplary embodiment, the amount of the first carrier gas injected is from 20% to 100% by volume of an amount of hydrogen gas injected. It has been confirmed that graphene nuclei are not generated, and, as a result, graphene is not synthesized in a case in which the injected amount is out of the above numerical range.

In still another exemplary embodiment, the amount of the second carrier gas injected is from 2 to 10 times the amount of the first carrier gas injected. It has been confirmed that the value of $I_{2D/G}$ in the Raman spectrum greatly increases and the ratio in which graphene is synthesized in a homogeneous single layer greatly increases when the injected amount is within the above numerical range.

In still another exemplary embodiment, the amount of the second carrier gas injected is from 2.5 to 8 times the amount of the first carrier gas injected. It has been confirmed that the surface coverage of graphene is improved when the injected amount is within the above numerical range. In other words, improvement in the surface coverage of graphene is not observed as compared to that in a one-step process when the amount of the second carrier gas injected is less than 2 times the amount of the first carrier gas injected, and there is a problem that the process coast increases since the surface coverage of graphene is not as much improved as the injected amount increases when the amount of the second carrier gas injected is more than 10 times the amount of the first carrier gas injected.

In still another exemplary embodiment, the amount of the second carrier gas injected is from 3.5 to 6 times the amount of the first carrier gas injected. A full surface coverage of graphene of 100% can be achieved when the injected amount is within the above numerical range. In the case of a process system such as the invention, a surface coverage of graphene of 100% cannot be achieved despite various changes in other process conditions when the amount of the second carrier gas injected is less than 3.5 times the amount of the first carrier gas injected, and there is a problem that the process cost increases as the surface coverage of graphene is not as much improved as the injected amount increases when the amount of the second carrier gas injected is more than 5 times the amount of the first carrier gas injected. Moreover, it has been confirmed that the value of $I_{D/G}$ in the Raman spectrum greatly decreases and the ratio in which high quality graphene is synthesized greatly increases when the injected amount is within the above numerical range.

In still another exemplary embodiment, the nitrogen compound is a nitrogen-containing aromatic compound. Examples of such a nitrogen-containing aromatic compound may include one or more kinds selected from pyridine ($C_5H_5N$), pentachloropyridine ($C_5Cl_5N$), melamine ($C_3H_6N_6$), acrylonitrile ($C_3H_3N_6$), hexaphenylborazine ($C_{36}H_{30}B_3N_3$), poly(4-vinylpyridine) (P4VP), 1,3,5-triazine ($C_3H_9N_3$), or piperidine ($C_5H_{11}N$), but the invention is not limited thereto.

In still another exemplary embodiment, the amount of the first carrier gas injected is from 40 to 60 sccm.

Hereinafter, the invention will be described in more detail with reference to the following Examples, but the scope and contents of the invention cannot be construed to be diminished or limited by the following Examples. In addition, it is obvious that a person skilled in the art can easily carry out the invention of which the experimental results are not specifically presented based on the teachings of the invention including the following Examples, and it is natural that such modifications and changes fall within the scope of the appended claims.

In addition, the experimental results presented below only show representative experimental results of the above-mentioned Examples and Comparative Examples, and the effect of each various embodiments of the invention which are not expressly set forth below will be specifically described in the corresponding section.

EXAMPLES

Example 1: Synthesis of Graphene Thin Film by One-Step Process

Figure 3:
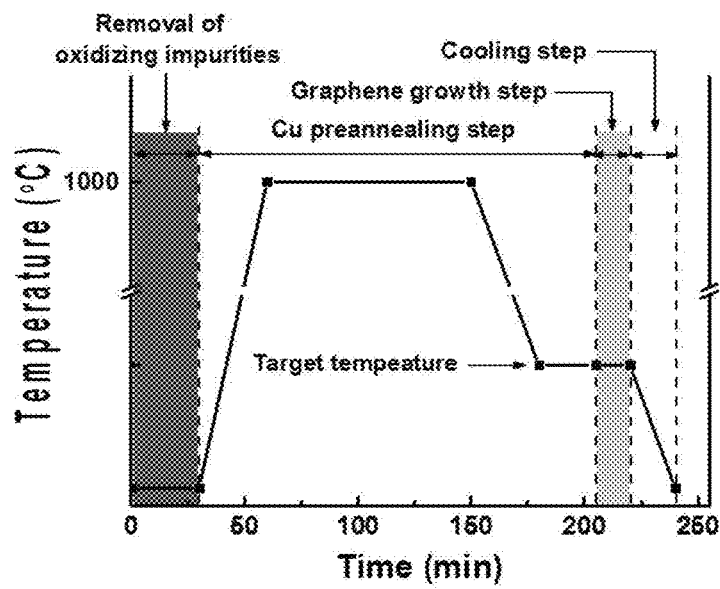
FIG. 3 is a process chart illustrating synthesis of a graphene thin film by a one-step process.

As illustrated in FIG. 3, a nitrogen-doped graphene thin film was directly synthesized in a large area using pyridine as a carbon source. The catalytic metal to be used in the synthesis of graphene was inserted into the chemical vapor deposition system, and a pumping and Ar purging process was repeatedly conducted several times in order to remove the gas remaining in the system. Thereafter, a heat treatment was conducted in a vacuum while allowing hydrogen gas to flow, in order to remove the metal oxide film existing on the surface of the catalytic metal, and increase the grain size of the catalytic metal.

The chemical vapor deposition system was then cooled to the temperature for graphene synthesis, and the atmosphere at 1 atm was formed through Ar purging. Pyridine was injected through a bubbler using Ar gas (50 sccm) as a carrier gas, hydrogen (150 sccm) gas was injected together with pyridine, and graphene was synthesized. The injection was conducted by constantly maintaining the flow rate during the synthesis process so that the one-step process proceeded.

Figure 4:
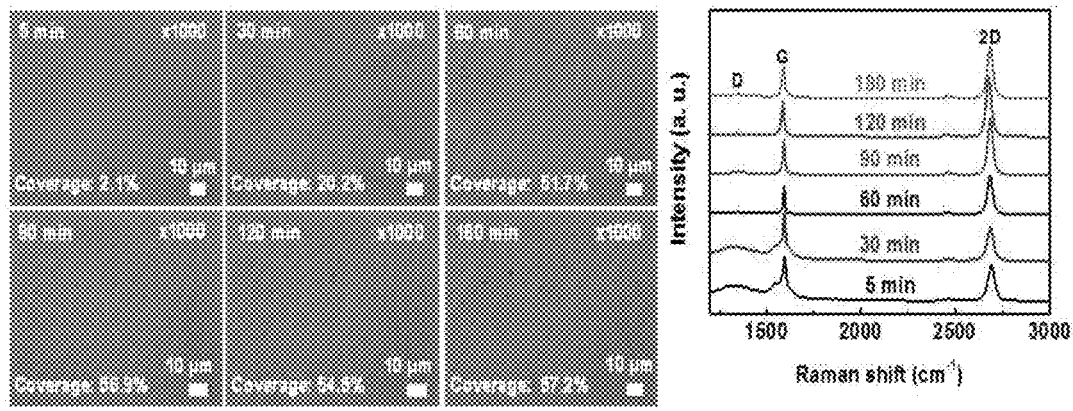
FIG. 4 illustrates the results on the optical microscope image and Raman spectrum of a graphene thin film synthesized by a one-step process depending on the synthesis time.
Figure 5:
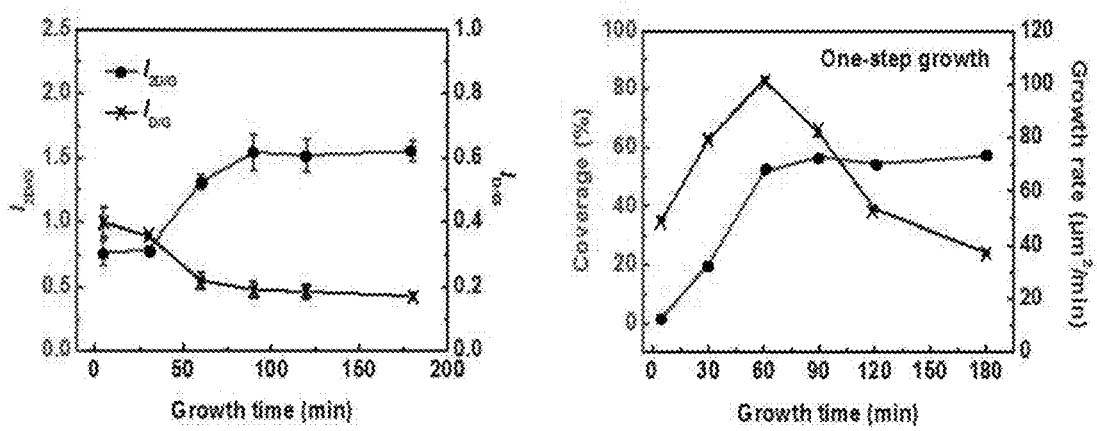
FIG. 5 illustrates the results on $I_{2G/D}$ and $I_{D/G}$ in the Raman spectrum, the surface coverage, and the growth rate of a graphene thin film synthesized by a one-step process depending on the synthesis time.

In the present Example, graphene was synthesized by maintaining the temperature for graphene synthesis at 300° C., and as a result, the surface coverage of graphene tended to increase as the synthesis time increased as illustrated in FIGS. 4 and 5. Specifically, graphene having a surface coverage of about 2.1% was synthesized when the synthesis time was 5 minutes, the surface coverage of graphene increased as the synthesis time increased, and graphene synthesized for 60 minutes had a surface coverage of about 51%. In the case of synthesizing graphene for an increased synthesis time of 180 minutes, the surface coverage of graphene was about 57% and the surface coverage was not thus significantly improved as compared to that of graphene synthesized for 60 minutes. From the optical microscope image and the Raman spectrum, it has been confirmed that graphene synthesized for 5 minutes has a small flake shape and is defective graphene having $I_{D/G}$ of about 0.4 and $I_{2D/G}$ of about 1. As the synthesis time increases, the lateral growth of graphene is promoted to increase the surface coverage and thus the unsaturated defects decrease to decrease $I_{D/G}$ and to increase $I_{2D/G}$. In the case of synthesizing graphene for 60 minutes or longer, it has been confirmed that the surface coverage of graphene is not greatly improved and the $I_{D/G}$ and $I_{2D/G}$ values are similar.

This result indicates that the domain size and surface coverage of graphene increase as the synthesis time increases, but the growth rate of graphene domain gradually decreases and an increase in the domain size is limited after a certain time, and the growth rate of graphene also decreases since the amount of carbon source adsorbed on the catalytic metal decreases as the synthesis of graphene on the catalytic metal proceeds. Hence, it is expected that a significantly long synthesis time is required in order to synthesize continuous thin film type graphene in a large area.

Example 2: Synthesis of Graphene Thin Film by Two-Step Process

Figure 6:
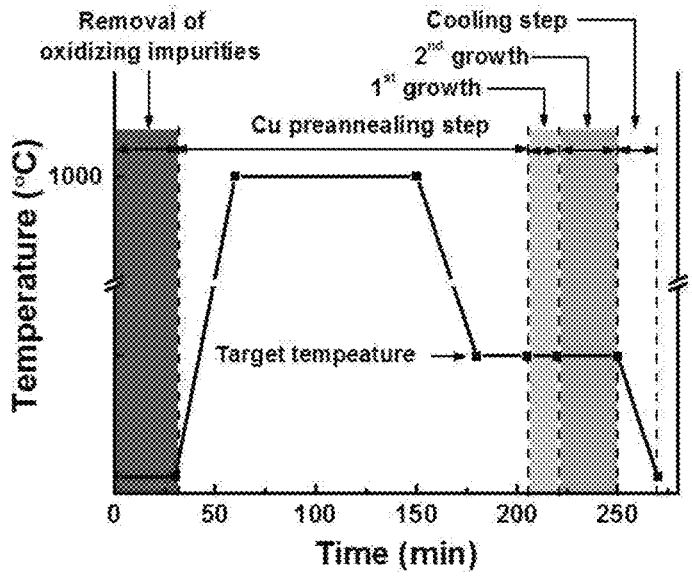
FIG. 6 is a process chart illustrating synthesis of a graphene thin film by a two-step process.

As described in Example 1, it has been confirmed that it is difficult to prepare a continuous graphene thin film in a large area in the case of synthesizing graphene using pyridine since the growth rate of the graphene domain gradually decreases as the synthesis time increases. A graphene thin film was synthesized by applying a two-step process as illustrated in FIG. 6 in order to solve such a problem, that is, in order to synthesize graphene having a surface coverage of 100%.

In the two-step synthesis process, the amount of pyridine injected in the second step was increased to be greater than that in the first step so that the amount of pyridine injected was differentiated. For example, Ar of a carrier gas and hydrogen were injected at 50 sccm and 150 sccm, respectively, and a great number of graphene flakes were formed for 30 minutes in the first step, and Ar of a carrier gas was injected at an increased flow rate of from 100 to 200 sccm, hydrogen was injected at 150 sccm, and graphene was synthesized for from 30 to 120 minutes in the second step.

Figure 7:
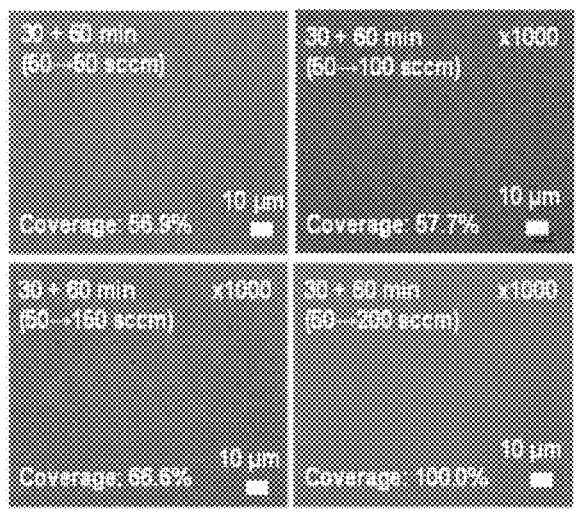
FIG. 7 illustrates the results on the optical microscope image and Raman spectrum of a graphene thin film synthesized by a two-step process depending on the flow rate of carrier gas in the second step.
Figure 7:
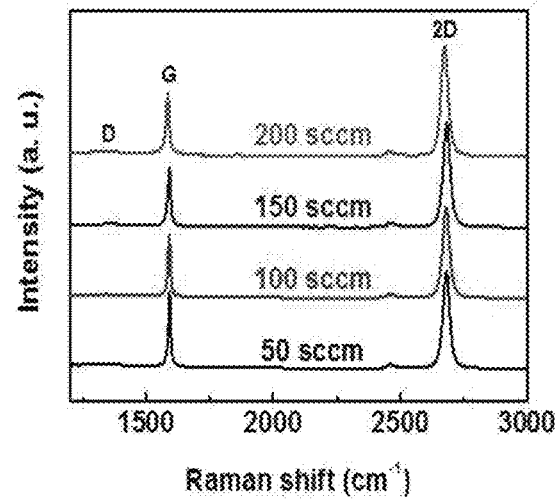
Figure 8:
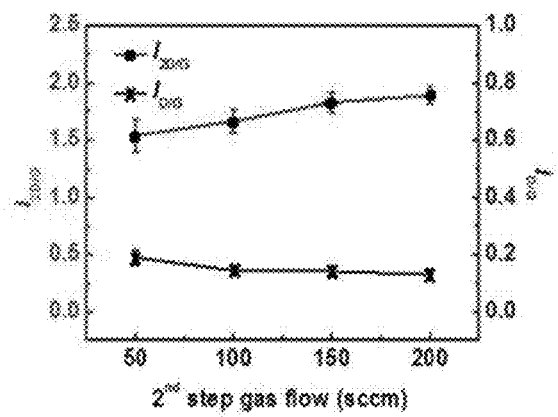
FIG. 8 illustrates the results on $I_{2G/D}$ and $I_{D/G}$ in the Raman spectrum and the surface coverage of a graphene thin film synthesized by a two-step process depending on the flow rate of carrier gas in the second step.
Figure 8:
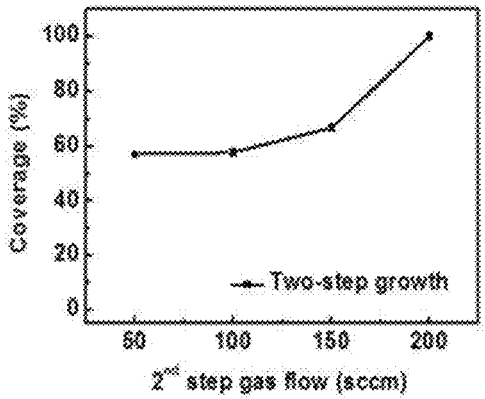

First, graphene was synthesized while controlling the flow rate of Ar of a carrier gas to from 50 to 200 sccm in the second step. As illustrated in FIGS. 7 and 8, by using the two-step process, it was confirmed that the growth rate of graphene domain was maintained fast in the lateral direction around the graphene flake and it was possible to improve particularly the surface coverage of graphene and to synthesize a continuous graphene thin film having a surface coverage of 100% in a large area. Specifically, the surface coverage of graphene was improved to about 58% when synthesis of graphene was conducted by injecting the carrier gas at 50 sccm in the first step and at 100 sccm in the second step. The surface coverage of graphene was greatly improved as the flow rate of carrier gas was increased to 150 sccm and 200 sccm in the second step, and graphene having a surface coverage of 100% was synthesized when the carrier gas was injected in the second step in an amount to be four times the amount of the carrier gas in the first step. It was possible to solve the problem of a decrease in the growth rate in the one-step process by increasing the amount of carbon source capable of participating in the synthesis of graphene through an increase in the amount of pyridine injected in the second step.

From the Raman spectrum, it has been confirmed that as the amount of carrier gas injected increases in the second step, the surface coverage increases through the rapid lateral growth of graphene, the number of unsaturated defects decrease, thus $I_{D/G}$ decreases and $I_{2D/G}$ increases. In the case of synthesizing graphene by injecting the carrier gas at 200 sccm in the second step, it has been confirmed that a homogeneous single layer graphene thin film has been synthesized as the contrast is constant in the optical microscope image and $I_{2D/G}$ in the Raman spectrum is about 2. In addition, it has been confirmed that high quality graphene has been synthesized as the edge portion of graphene is decreased by the formation of a continuous graphene thin film and $I_{D/G}$ indicating defects is about 0.1.

Figure 9:
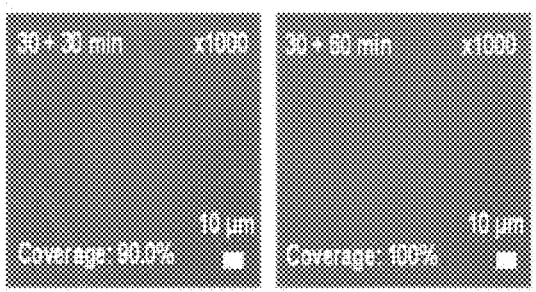
FIG. 9 illustrates the results on the optical microscope image and Raman spectrum of a graphene thin film synthesized by a two-step process depending on the synthesis time in the second step.
Figure 9:
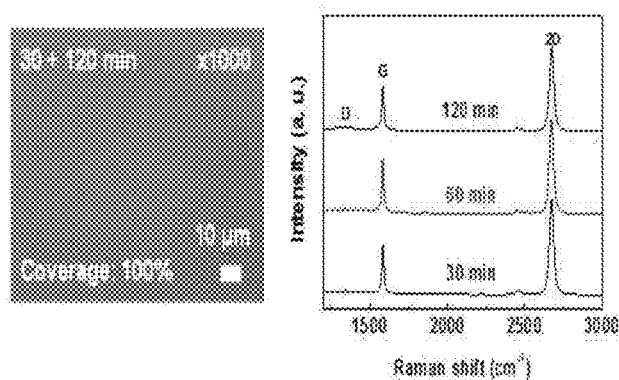
Figure 10:
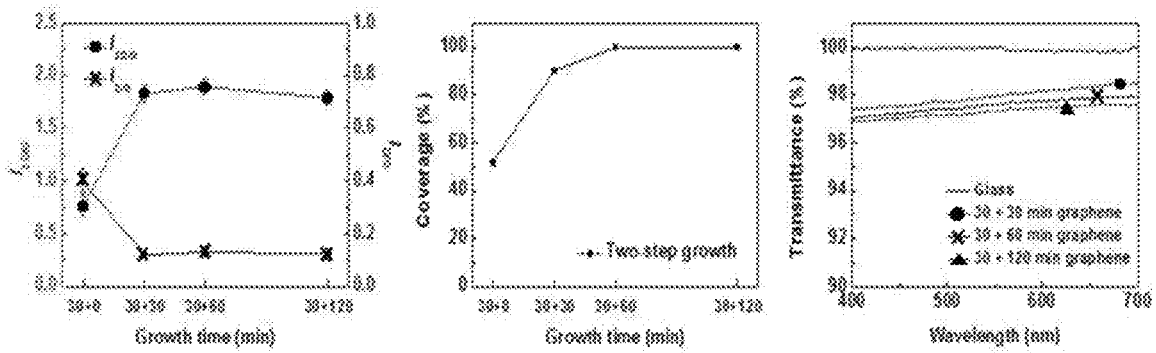
FIG. 10 illustrates the results on $I_{2G/D}$ and $I_{D/G}$ in the Raman spectrum, the surface coverage, and the transmittance of a graphene thin film synthesized by a two-step process depending on the synthesis time in the second step.

Next, graphene was synthesized while controlling the time for synthesis process to from 30 to 120 minutes in the second step. Specifically, Ar of a carrier gas and hydrogen were injected at 50 sccm and 150 sccm, respectively, and a great number of graphene flakes were formed for 30 minutes in the first step, and Ar of a carrier gas was injected at an increased flow rate of 200 sccm, hydrogen was injected at 150 sccm, and graphene was synthesized for from 30 to 120 minutes in the second step. As illustrated in FIGS. 9 and 10, the surface coverage of graphene was improved from 51% to 90% when the first step process was conducted for 30 minutes and the second step process was conducted for 30 minutes and graphene having a surface coverage of 100% was synthesized when the second step process was conducted for 60 minutes or longer. When the transmittance of graphene is measured, it has been confirmed that the transmittance decreases as the growth time in the second step process increases. As the growth time increases, the surface coverage increases, thus the absorbency by graphene increases, and the transmittance decreases. The transmittance of graphene having a surface coverage of 100% was 97.6% to indicate a typical absorptance of 2.3% by single layer graphene.

Figure 11:
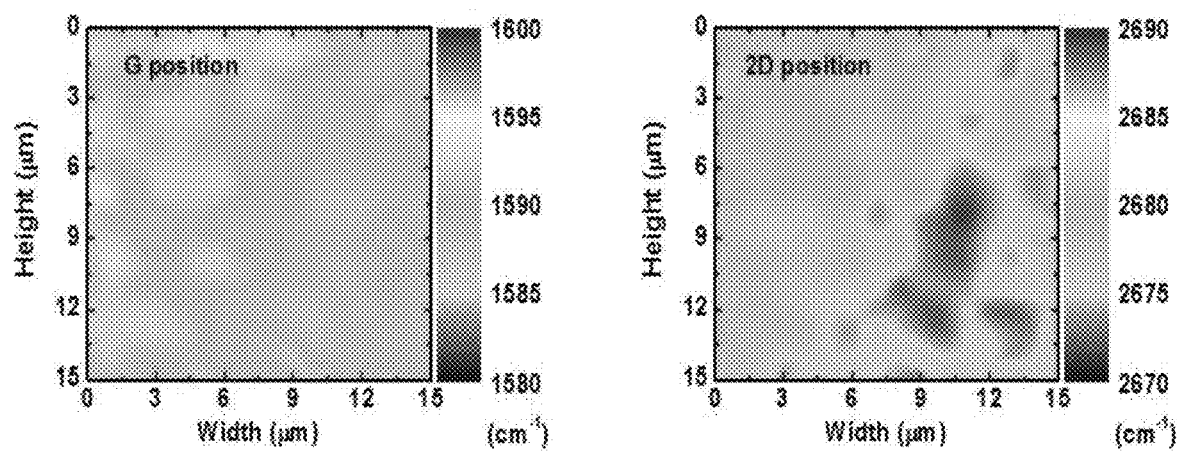
FIG. 11 illustrates the results on a Raman mapping image at the positions of 2D and G peaks of graphene synthesized by a two-step process.
Figure 12:
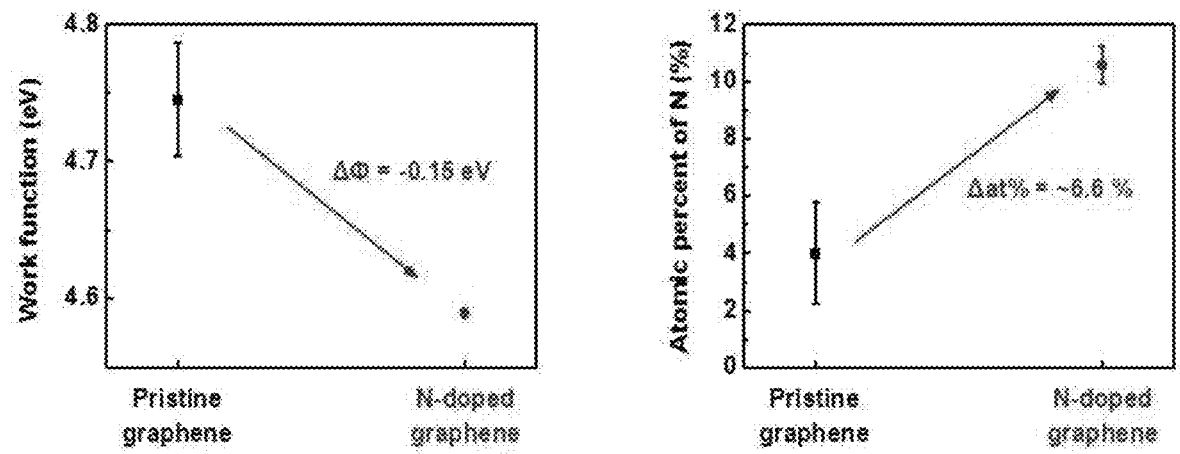
FIG. 12 illustrates the results on comparative analysis of the work function and the concentration of nitrogen element between graphene synthesized by a two-step process and graphene which is not doped with nitrogen.

As illustrated in FIGS. 11 and 12, the nitrogen doping effect on graphene synthesized using pyridine has been confirmed. Generally, when electrons are doped on graphene, the position of G peak appears at a high wave number and the position of 2D peak appears at a low wave number as compared to the positions of G peak and 2D peak in the Raman spectrum of pristine graphene. It has been confirmed that electrons are doped on the entire graphene by nitrogen doping since the position of G peak of graphene synthesized using pyridine appears at a wave number higher than that (1580 cm$^{-1}$) of the position of G peak of pristine graphene in all regions and the position of 2D peak appears at a wave number lower than that (2680 cm$^{-1}$) of the position of 2D peak of pristine graphene in the region of 80% or more.

The work functions of pristine graphene and graphene synthesized using pyridine were measured by an ultraviolet photoelectron spectroscopy (UPS) and compared to each other. The work function of graphene synthesized using pyridine is about 4.59 eV to be lower than the work function of pristine graphene of about 4.74 eV by the nitrogen doping effect. In addition, the nitrogen content in graphene was measured by energy dispersive spectroscopy (EDS), and as a result, it has been confirmed that graphene is doped with nitrogen derived from pyridine since the concentration of nitrogen in graphene synthesized using pyridine is about 10 at % to be higher by about 6 at % than the concentration of nitrogen in pristine graphene of about 4 at %.

Figure 13:
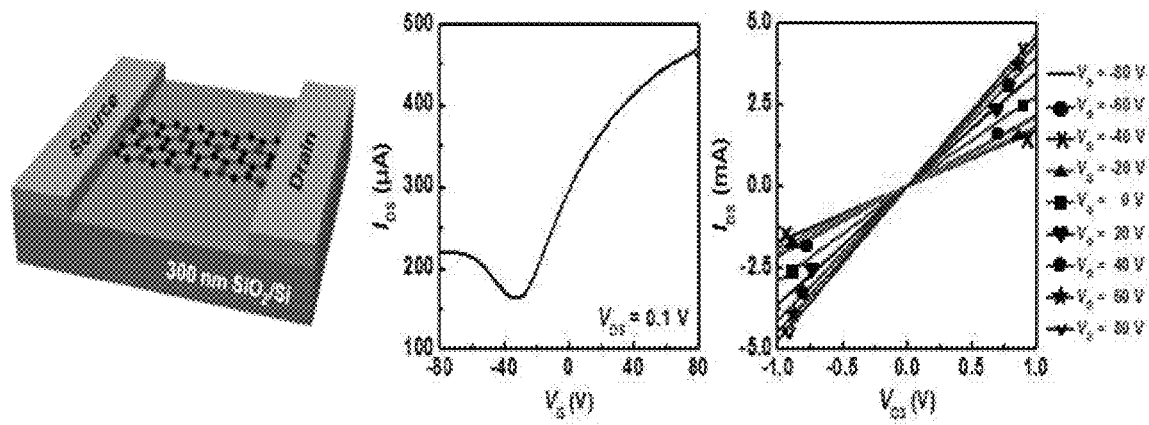
FIG. 13 illustrates a schematic diagram and $I_d$-$V_g$ and $I_d$-$V_d$ properties of a field-effect transistor fabricated using graphene synthesized by a two-step process.

As illustrated in FIG. 13, a transistor was fabricated using the graphene thus synthesized, the electrical properties thereof were examined, and as a result, the transistor exhibited the behavior of an n-type transistor. This is because the Fermi level of graphene increases by nitrogen doping and electrons thus act as a major carrier. In addition, the charge mobility in the transistor is about 600 $cm^2/Vs$ to be improved by 10 times the result previously reported.

Example 3: Synthesis of Continuous Graphene Thin Film in Large Area by One-Step Process In order to confirm whether the improved results in Example 2 above were a result only by an increased amount of Ar injected (namely, increased amount of pyridine injected accordingly), a graphene thin film was synthesized by conducting an experiment by a one-step process in the same manner as in Example 1 except that the amount of Ar injected was changed from 50 sccm to 200 sccm.

As a result, it has been confirmed that graphene has not been synthesized. It has been confirmed that the flow ratio of carrier gas to hydrogen gas is required to be in a range of from 1:1 to 1:5 in order to generate graphene nuclei in the first step and thus graphene cannot be synthesized since graphene nuclei are not generated when graphene is synthesized by increasing the amount of Ar injected in the first step in order to rapidly grow graphene. It has been confirmed that it is possible to synthesize a continuous graphene thin film when graphene flakes are formed by injecting Ar at 50 sccm in the first step and the growth rate of graphene domain is increased by increasing the amount of Ar injected in the second step.

According to various embodiments of the invention, it is possible to achieve an effect of synthesizing graphene having an improved surface coverage and a uniform single layer as well as preparing high quality graphene in a large area. In addition, an aromatic compound containing nitrogen is used as a carbon source and nitrogen-doped graphene can be thus synthesized as nitrogen is doped in the synthesis process, thus it is possible to achieve an effect of controlling the electrical properties of graphene depending on the nitrogen doping.

What is claimed is:

1. A method of preparing nitrogen-doped graphene, the method comprising:
    (a) loading a catalytic metal into a chemical vapor deposition system;
    (b) increasing an internal temperature of the chemical vapor deposition system to conduct a heat treatment of the catalytic metal; and
    (c) injecting a nitrogen compound into the chemical vapor deposition system
    wherein the injection of a nitrogen compound in the step (c) comprises:
    injecting the nitrogen compound in a first amount of a first nitrogen compound; and
    then injecting the nitrogen compound in a second amount of second nitrogen compound wherein:
    the second amount of the second nitrogen compound injected is greater than the first amount of the first nitrogen compound injected.

2. The method of preparing nitrogen-doped graphene according to claim 1, wherein the injection of the nitrogen compound in the step (c) comprises:
    generating the nitrogen compound using a bubbler; and
    injecting the nitrogen compound using an inert gas as a carrier gas.

3. The method of preparing nitrogen-doped graphene according to claim 2, comprising:
    injecting hydrogen gas together with the nitrogen compound in the step (c).

4. The method of preparing nitrogen-doped graphene according to claim 1, comprising:
    controlling the first amount of first nitrogen compound and the amount of second nitrogen compound by a first amount of a first carrier gas injected and a second amount of a second carrier gas injected, respectively.

5. The method of preparing nitrogen-doped graphene according to claim 4, wherein the first amount of the first carrier gas injected is from 20% to 100% by volume of an amount of hydrogen gas injected.

6. The method of preparing nitrogen-doped graphene according to claim 5, wherein the second amount of the second carrier gas injected is from 2 to 10 times the first amount of the first carrier gas injected.

7. The method of preparing nitrogen-doped graphene according to claim 6, wherein the second amount of the second carrier gas injected is from 2.5 to 8 times the first amount of the first carrier gas injected.

8. The method of preparing nitrogen-doped graphene according to claim 7, wherein the second amount of the second carrier gas injected is from 3.5 to 6 times the first amount of the first carrier gas injected.

9. The method of preparing nitrogen-doped graphene according to claim 8, wherein the nitrogen compound is a nitrogen-containing aromatic compound.

10. The method of preparing nitrogen-doped graphene according to claim 9, wherein the nitrogen-containing aromatic compound is one or more kinds selected from the group consisting of: pyridine, pentachloropyridine, melamine, acrylonitrile, hexaphenylborazine, poly(4-vinylpyridine), 1,3,5-triazine, and piperidine.

11. The method of preparing nitrogen-doped graphene according to claim 10, wherein the first amount of the first carrier gas injected is from 40 to 60 sccm.

* * * * *